United States Patent
Kato

(10) Patent No.: US 10,396,207 B2
(45) Date of Patent: Aug. 27, 2019

(54) METHOD FOR MANUFACTURING THIN FILM TRANSISTOR SUBSTRATE

(71) Applicant: Sakai Display Products Corporation, Osaka (JP)

(72) Inventor: Masahiro Kato, Osaka (JP)

(73) Assignee: SAKAI DISPLAY PRODUCTS CORPORATION, Osaka (JP)

( * ) Notice: Subject to any disclaimer, the term of this patent is extended or adjusted under 35 U.S.C. 154(b) by 0 days.

(21) Appl. No.: 15/964,026

(22) Filed: Apr. 26, 2018

(65) Prior Publication Data

US 2018/0248031 A1 Aug. 30, 2018

Related U.S. Application Data

(63) Continuation-in-part of application No. PCT/JP2015/080617, filed on Oct. 29, 2015.

(51) Int. Cl.
*H01L 29/786* (2006.01)
*G02F 1/1333* (2006.01)
(Continued)

(52) U.S. Cl.
CPC ...... *H01L 29/786* (2013.01); *G02F 1/133345* (2013.01); *G02F 1/133514* (2013.01);
(Continued)

(58) Field of Classification Search
None
See application file for complete search history.

(56) References Cited

U.S. PATENT DOCUMENTS 6,989,300 B1 * 1/2006 Tanabe ............... H01L 21/2026
438/166
2003/0201440 A1 10/2003 Satou et al.
(Continued)

FOREIGN PATENT DOCUMENTS

JP 2001148480 A 5/2001
JP 2005051208 A 2/2005
(Continued)

OTHER PUBLICATIONS

English Translation of PCT International Search Report, PCT Application No. PCT/JP2015/080617, Japan Patent Office, dated Jan. 19, 2016.

*Primary Examiner* — Bradley Smith
(74) *Attorney, Agent, or Firm* — Marsh Fischmann & Breyfogle LLP

(57) ABSTRACT

There is provided a manufacturing method for a thin-film transistor substrate, which enables to excellently perform alignment between an annealed region of a semiconductor film and a mask pattern of a conductive film. The method comprises annealing a semiconductor film being formed on a gate insulation film covering a gate electrode with a laser beam by using a mask, the gate electrode being formed within a thin-film transistor substrate region on a substrate; forming a first alignment mark outside the thin-film transistor substrate region on the substrate, by irradiating the substrate through the mask with the laser beam; patterning the semiconductor film; forming a conductive film on the semiconductor film; positioning a photomask on the basis of the first alignment mark; and forming a source electrode and a drain electrode by patterning the conductive film through the photomask; wherein the first alignment mark is formed while annealing the semiconductor film.

8 Claims, 13 Drawing Sheets

(51) Int. Cl.
  *G02F 1/1335* (2006.01)
  *G02F 1/1362* (2006.01)
  *H01L 27/12* (2006.01)
  *G02F 1/1368* (2006.01)

(52) U.S. Cl.
  CPC ...... *G02F 1/136286* (2013.01); *H01L 27/124* (2013.01); *G02F 1/1368* (2013.01); *G02F 2001/133354* (2013.01); *G02F 2201/123* (2013.01)

(56) References Cited

U.S. PATENT DOCUMENTS

| | | |
|---|---|---|
| 2005/0012098 A1 | 1/2005 | Satou et al. |
| 2005/0012228 A1 | 1/2005 | Hiramatsu et al. |
| 2006/0284175 A1 | 12/2006 | Hiramatsu et al. |
| 2007/0045624 A1 | 3/2007 | Satou et al. |
| 2007/0117292 A1* | 5/2007 | Kimura ............... H01L 27/1281 438/166 |
| 2012/0133914 A1 | 5/2012 | Prosyentsov et al. |
| 2015/0029481 A1 | 1/2015 | Prosyentsov et al. |
| 2017/0123323 A1 | 5/2017 | Prosyentsov et al. |
| 2018/0122839 A1* | 5/2018 | Nodera ................. H01L 29/786 |

FOREIGN PATENT DOCUMENTS

| | | |
|---|---|---|
| JP | 2011029411 A | 2/2011 |
| JP | 2012119680 A | 6/2012 |

* cited by examiner

METHOD FOR MANUFACTURING THIN FILM TRANSISTOR SUBSTRATE

CROSS-REFERENCE TO RELATED APPLICATION

This is a continuation-in-part of PCT international application No. PCT/JP2015/080617 filed on Oct. 29, 2015, incorporated herein by reference.

TECHNICAL FIELD

The present invention relates to a manufacturing method for a thin-film transistor substrate (hereinafter referred to as a TFT substrate) provided in display apparatus for, for example, a television receiver, a personal computers.

BACKGROUND OF THE INVENTION

Within the field of the display apparatus, a liquid crystal display apparatus can have characteristics of thin profile and low power consumption. A liquid crystal display apparatus provided with a TFT substrate, having a switching element such as thin-film transistor (TFT) at each pixel, especially has a high contrast ratio and excellent response characteristics and exhibits high performance. Therefore, it is suitably used for, for example, a television receiver, a personal computer.

A plurality of gate lines (scan lines) and a plurality of source lines (signal lines) each crossing the respective gate lines with an insulation layer between are formed on the TFT substrate, and TFTs for switching the pixels are provided near the respective intersections where the gate lines cross source lines.

An exemplary example of a manufacturing method for a TFT substrate is described below.

First, a gate line is formed on a mother glass substrate, and a gate insulation film made of, for example, SiNx is formed so as to cover the upper sides of a gate line and a gate electrode, which is a part of the gate line. Further, a semiconductor film made of, for example, an amorphous silicon is formed by CVD.

Conventionally, the polycrystalline silicon is formed by treating an entire surface of the formed semiconductor film with heating or laser radiation, but recently, a method in which only a necessary portion is polycrystallized has been proposed (for example, JP 2011-029411 A). When a partial polycrystallization is required, the semiconductor film is subjected to a laser annealing process (hereinafter referred to as annealing process). The annealing process is a process in which a predetermined portion of the semiconductor film is irradiated with an energy beam to convert that portion into a polysilicon film. The polysilicon film corresponds to a channel region.

The annealing process is performed by using an annealing apparatus. For example, the annealing process is performed by irradiating a predetermined portion on a mother glass substrate, which is provided on a substrate stage, with a laser beam which is emitted by a laser oscillator provided in the annealing apparatus and guided through an optical system and a light guide path to pass through a mask stage on which a mask 50 (see below) with any aperture pattern is arranged. Alignment of the position of the mask 50 with respect to the mother glass substrate is performed on the basis of gate line pattern.

By performing an exposure using a mask and a development (hereinafter performing exposure and development is referred to as photolithography), a dry etching of the semiconductor film, and then, a removal of a resist, for example, the semiconductor film including a polysilicon region is patterned into an island shape.

Next, a source electrode and a drain electrode are formed by forming a conductive film (source film) made of, for example, Cu on the semiconductor film by sputtering, and performing a patterning by photolithography using a mask. Examples of an exposure apparatus for this process include an apparatus which projects an image of an original pattern formed in a photomask 60 (see below) onto a TFT substrate through a projection optical system.

Then, a passivation film, an interlayer insulation film, and a pixel electrode are formed accordingly.

FIG. 16 shows a schematic plan view of a TFT array region (TFT substrate region) 30 and a projected region on which a photomask 60 is projected on a mother glass substrate 70. FIG. 16 shows an example in which a plurality of TFT array regions 30 are cut out from the mother glass substrate 70.

The reference numeral 61 in FIG. 16 indicates an alignment mark formed on the photomask 60 to align the photomask 60 with which to perform a patterning of the above-described conductive film with the TFT array region 30. The alignment mark 61 is formed at the four corners of the photomask 60.

On a surface of the mother glass substrate 70, a plurality of alignment marks are formed outside the TFT array region 30 when performing a gate line patterning in the TFT array regions 30. Alignment is performed by reading an alignment mark on the mother glass substrate 70 and an alignment mark 61.

Namely, the position of the photomask 60 with respect to the TFT array region 30 will be adjusted by detecting a displacement between the alignment mark 61 and the alignment mark on the mother glass substrate 70.

It is necessary to retain the accuracy of the alignment high between the above-described annealed portion of the semiconductor film and the mask pattern for the conductive film including a source electrode, a drain electrode, a source line, and a drain connecting line.

As described above, after aligning the mask 50 with the mother glass substrate 70 on the basis of the gate lines and partially annealing the semiconductor film, the photomask 60 is aligned with the mother glass substrate 70 on the basis of the alignment mark 61 and the alignment mark on the mother glass substrate 70 and the conductive film is subjected to the patterning. However, since positions are not directly adjusted between the annealed portion and the photomask 60 for the conductive film (source film), it is difficult to attain a required positional accuracy.

FIG. 17 shows a schematic plan view of a positional relationship between a projected region on which the mask 50 is projected and a projected region on which the photomask 60 is projected.

As shown in FIG. 17, in an example of this annealing apparatus, a plurality of masks 50 are arranged in a column direction of the TFT array region 30, and simultaneously subjected to the annealing process, and then, the annealing apparatus is moved relatively in the row direction of the TFT array region 30, and annealing process is performed accordingly.

As shown in FIG. 17, the size of the mask 50 used for the annealing apparatus and the size of the photomask 60 used for the exposure apparatus are different. Specifically, while the size of the photomask 60 is approximately 1.5 m square, the size of the mask 50 for the laser annealing is approximately 30 cm square, and thus, their sizes are completely different, making it impossible to completely correct a displacement amount for each mask 50 generated due to the use of the smaller masks 50 than the photomask 60 when the alignment of the mask 60 is performed.

Further, a part of the uppermost mask 50 and a part of the lowermost masks 50 out of the plurality of masks 50 protrude from both long sides of the photomask 60, and it was impossible to adjust the arrangement of the photomask 60 in accordance with the arrangement of the mask 50.

JP 2012-119680 A discloses forming a pattern in a periphery of the photomask to calculate and correct a displacement of the mask (due to, for example, a thermal expansion or optical-path aberration), and then, correcting local position deviation according to a position deviation of a mask. Thereby, a displacement of a film of the bottom layer has been improved and a positional accuracy of a film overlaid on top of the film has been enhanced.

In JP 2012-119680 A, all the shapes of masks and the exposure apparatus to be used for all films are supposed to be same. In the case where a process is performed by using a mask which is completely different in size from a mask for exposure of a predetermined pattern, and a high positional accuracy between them is needed, it is considered difficult for the technique disclosed in No. 2012-119680 to actualize the required accuracy.

SUMMARY OF THE INVENTION

The present invention has been made in view of the above circumstances, and an object of the present invention is to provide a manufacturing method for a thin-film transistor substrate, which enables to excellently perform alignment between an annealed region of a semiconductor film and a pattern of a conductive film, thereby a satisfactory positional accuracy between the annealed region and source line, for example, is attained and variations in positional accuracy can be reduced between TFTs.

A manufacturing method of a thin-film transistor substrate according to one embodiment of the present invention includes: annealing a semiconductor film being formed on a gate insulation film covering a gate electrode with a laser beam by using a mask, the gate electrode being formed within a thin-film transistor substrate region on a substrate; forming a first alignment mark outside the thin-film transistor substrate region on the substrate, by irradiating the substrate through the mask with the laser beam; patterning the semiconductor film by photolithography and etching; forming a conductive film on the semiconductor film; positioning a photomask on the basis of the first alignment mark; and forming a source electrode and a drain electrode by patterning the conductive film through the photomask; wherein the first alignment mark is formed while annealing the semiconductor film.

According to the present disclosure, variations in positional accuracy can be reduced between TFTs.

DETAILED DESCRIPTION

The present invention will be concretely described below with reference to drawings showing some embodiments of the present invention.

Embodiment 1

Figure 1:
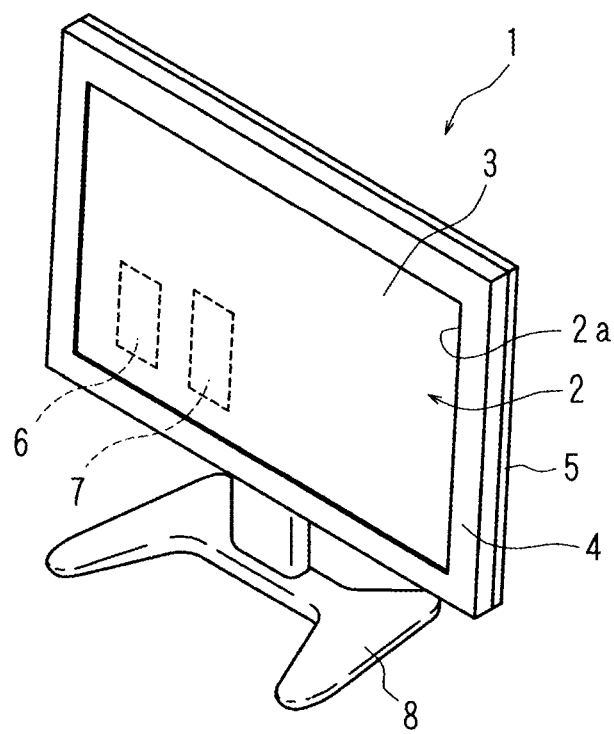
FIG. 1 shows a schematic perspective view of a television receiver according to Embodiment 1.
Figure 2:
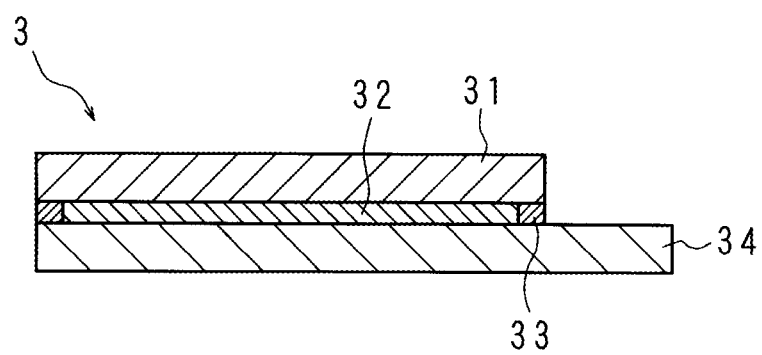
FIG. 2 shows a schematic cross-sectional view of a liquid crystal display panel according to Embodiment 1.
Figure 3:
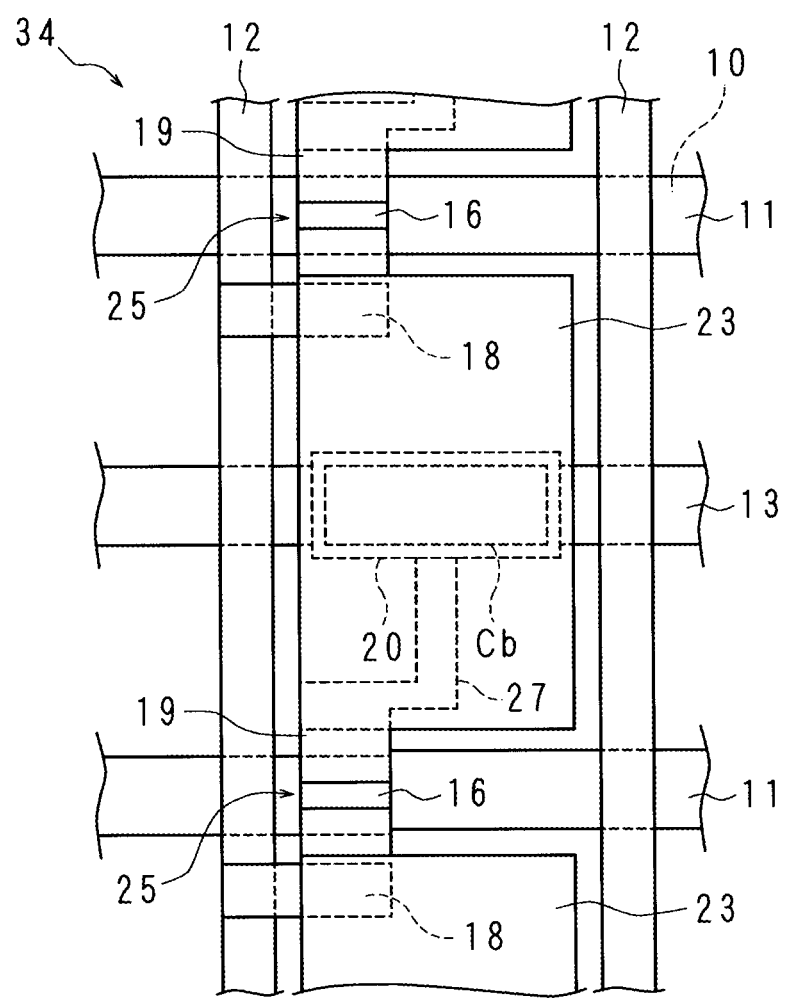
FIG. 3 shows a schematic plan view of pixels on a TFT substrate according to Embodiment 1.
Figure 4:
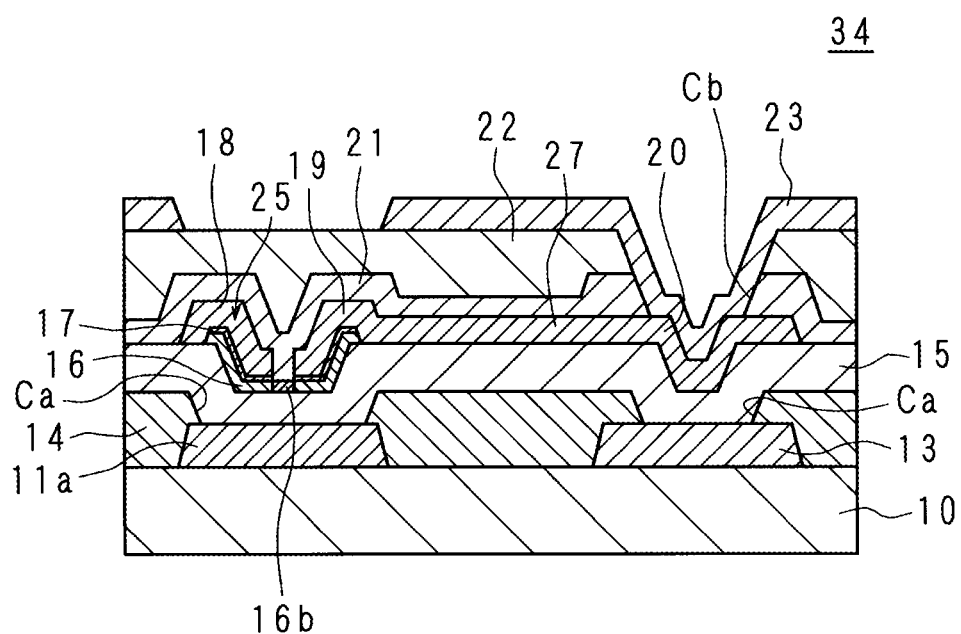
FIG. 4 shows a schematic cross-sectional view of a portion of the TFT substrate according to Embodiment 1, in which a TFT is formed.
Figure 5:
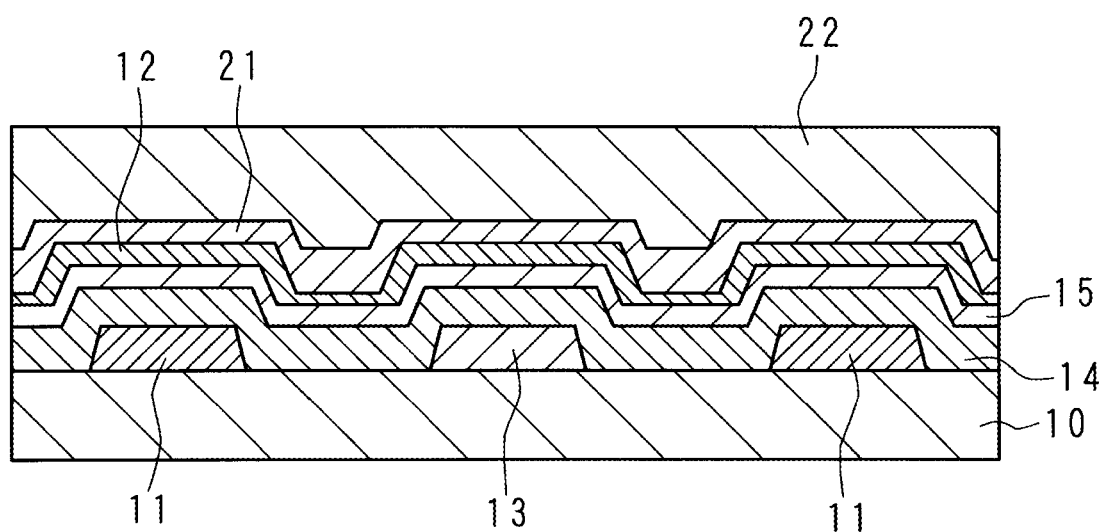
FIG. 5 shows a schematic cross-sectional view of a portion of the TFT substrate according to Embodiment 1, in which a source line and gate line cross.

FIG. 1 shows a schematic perspective view of the TV receiver 1 according to Embodiment 1, FIG. 2 shows a schematic cross-sectional view of a display panel 3 according to Embodiment 1, FIG. 3 shows a schematic plan view of pixels on a TFT substrate 34 according to Embodiment 1, FIG. 4 shows a schematic cross-sectional view of a portion of the TFT substrate 34 according to Embodiment 1, in which a TFT 25 is arranged, and FIG. 5 shows a schematic cross-sectional view of a portion of the TFT substrate 34 according to Embodiment 1, in which a source line 12 and gate line 11 cross.

The TV receiver 1 includes a horizontally long display module 2 with which to display an image, a tuner 6 with which to receive a broadcast wave from an antenna (not shown), and a decoder 7 with which to decode an encoded broadcast wave. The TV receiver 1 may display an image on the display module 2 according to decoded information output by the decoder 7, which decodes the broadcast wave received by the tuner 6. A stand 8 with which to support the TV receiver 1 is provided at the bottom part of TV receiver 1.

When the display module 2 is, for example, of an edge light type, it may include a display panel 3, three, for example, of optical sheets (not shown), a light-guiding plate, a reflection sheet (not shown), and a chassis (not shown).

The display module 2 is housed substantially vertically to an installation surface between a front cabinet 4 and a rear cabinet 5, which are disposed substantially vertically to an installation surface on the front and the rear of the display module 2, respectively. The front cabinet 4 may have a rectangular frame body covering the periphery of the display module 2, with a rectangular opening 2a in the center. The rear cabinet 5 may have a rectangular tray-like shape with an opened front side. Vertical and horizontal dimensions of the front cabinet 4 and the rear cabinet 5 may be substantially the same, and their respective peripheral edges are opposed to each other.

The display panel 3 includes a TFT substrate 34 and a CF substrate (color filter substrate) 31, which are disposed facing each other, a liquid crystal layer 32 disposed between the TFT substrate 30 and the CF substrate 31 as a display medium layer, and a sealing member 33 provided in a frame shape with which to bond the TFT substrate 30 and the CF substrate 31 as well as to seal the liquid crystal layer 32 between the TFT substrate 30 and the CF substrate 31.

As shown in FIG. 3, the TFT substrate 34 includes on an insulation substrate 10 such as a glass substrate a plurality of gate lines 11 disposed so as to extend parallel to each other, a plurality of capacitor lines 13 each disposed between the respective gate lines 11 and extending parallel to each other, a plurality of source lines 12 disposed so as to extend parallel to each other in a direction crossing the gate lines 11, a plurality of TFTs 25 each provided for each of the regions formed by crossing the gate lines 11 and source lines 12, which is, pixel regions, a plurality of pixel electrodes 23 arranged in a matrix and each connected to the respective TFTs, and an alignment film (not shown) arranged so as to cover the respective pixel electrodes 23.

As shown in FIG. 5, at the region of the TFT substrate 34 in which the gate line 11 and the source line 12 cross, an interlayer insulation film 14 and a gate insulation film 15 are interposed between the gate lines 11 formed on the insulation substrate 10 and the source lines 12. The interlayer insulation film 14 may be formed using, for example, SOG (spin-on-glass) material or acrylic resin.

However, the interlayer insulation film 14 may not be provided.

In addition, a passivation film 21 is formed to cover the source line 12, and an interlayer insulation film 22 containing an organic material such as acrylic resin is formed to cover and flatten the passivation film 21. The pixel electrodes 23 (see FIG. 3) are formed in a pattern on the interlayer insulation film 22.

As shown in FIG. 4, an opening Ca, Ca is formed such that the portion other than the edge portion of the gate electrode 11a or the edge portion of the capacitor line 13 is not covered by the interlayer insulation film 14. The gate insulation film 15 is formed over the interlayer insulation film 14, the gate electrode 11a, and the capacitor line 13. A first semiconductor film 16 made of intrinsic amorphous silicon is formed on a portion of the gate insulation film 15 provided at the corresponding position to the opening Ca formed on the gate electrode 11a, and a polysilicon film 16b is formed on a portion of the gate insulation film 15, the portion corresponding to the central part of the opening Ca. The polysilicon film 16b corresponds to a channel region. Further, a second semiconductor film 17 made of n+ amorphous silicon doped with P (phosphor) is formed to cover the first semiconductor film 16 so as to form a source region and a drain region. A source electrode 18 and a drain electrode 19 are respectively formed on the source region and the drain region. The gate electrode 11a, the gate insulation film 15, the first semiconductor film 16, the polysilicon film 16b, the second semiconductor film 17, the source electrode 18, and the drain electrode 19 constitute the TFT 25.

As shown in FIGS. 3 and 4, a capacitor electrode 20 is formed on a portion of the gate insulation film 15 provided at the corresponding position to the capacitor line 13. The pixel electrode 23 is formed on the capacitor electrode 20.

The pixel electrode 23 is connected to the capacitor electrode 20 in the opening Cb, which is provided above the opening Ca, and the capacitor electrode 20 overlap the capacitor line 13 via the gate insulation film 15, so that an auxiliary capacitor is constituted. The capacitor electrode 20 is connected to the drain electrode 19 through drain line 27.

In each pixel of the display panel 3, a gate signal is sent from a gate driver (not shown) through the gate line 11 to the gate electrode 11a and a source signal which corresponds to the image data is sent from a source driver (not shown) through the source line 12 to the source electrode 18. At the timing at which a gate of the TFT 25 is turned on, the source signal is transmitted to a drain electrode 19, a drain connection line 27, and a pixel electrode 23, generating a potential difference between a common electrode and the pixel electrode 23 in accordance with the applied voltage and changing the transmittance of the liquid crystal layer 32 thereby to display an image.

Figure 7D:
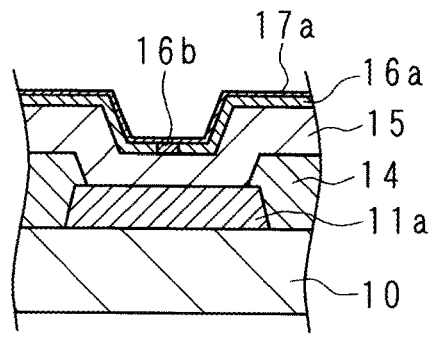
FIGS. 7D, 7E, and 7F show schematic cross-sectional views of manufacturing steps in the manufacturing method for the TFT array region according to Embodiment 1.
Figure 7E:
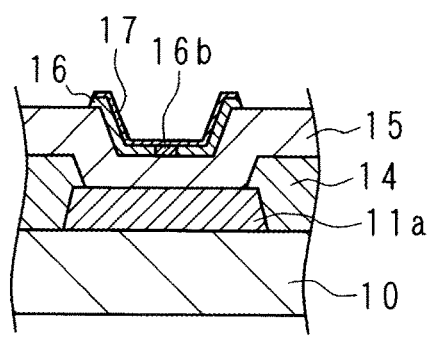
Figure 7F:
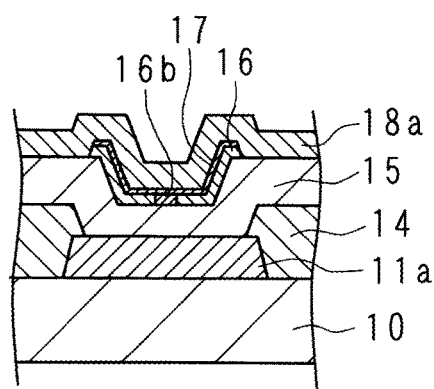
Figure 8G:
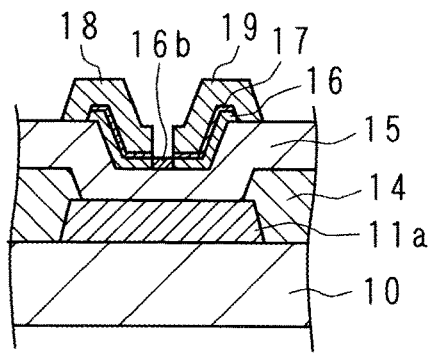
FIGS. 8G, 8H, and 8I show schematic cross-sectional views of manufacturing steps in the manufacturing method for the TFT array region according to Embodiment 1.
Figure 8H:
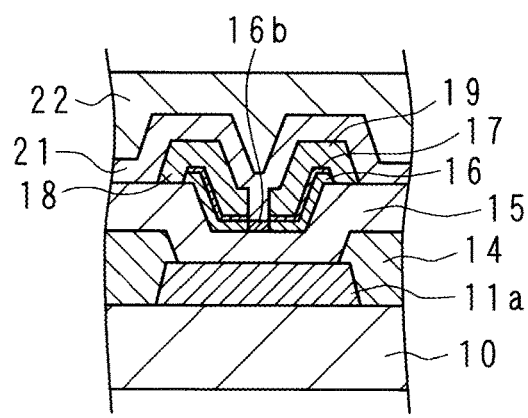
Figure 8I:
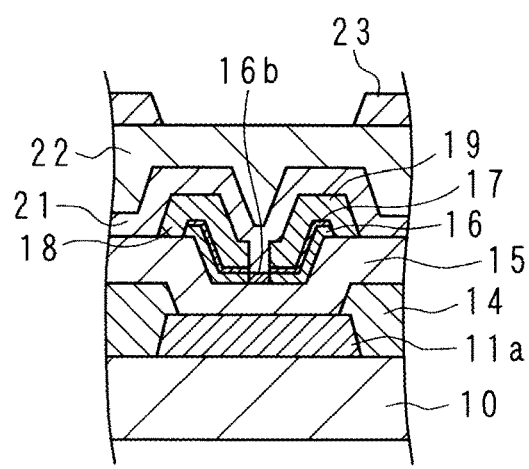
Figure 9:
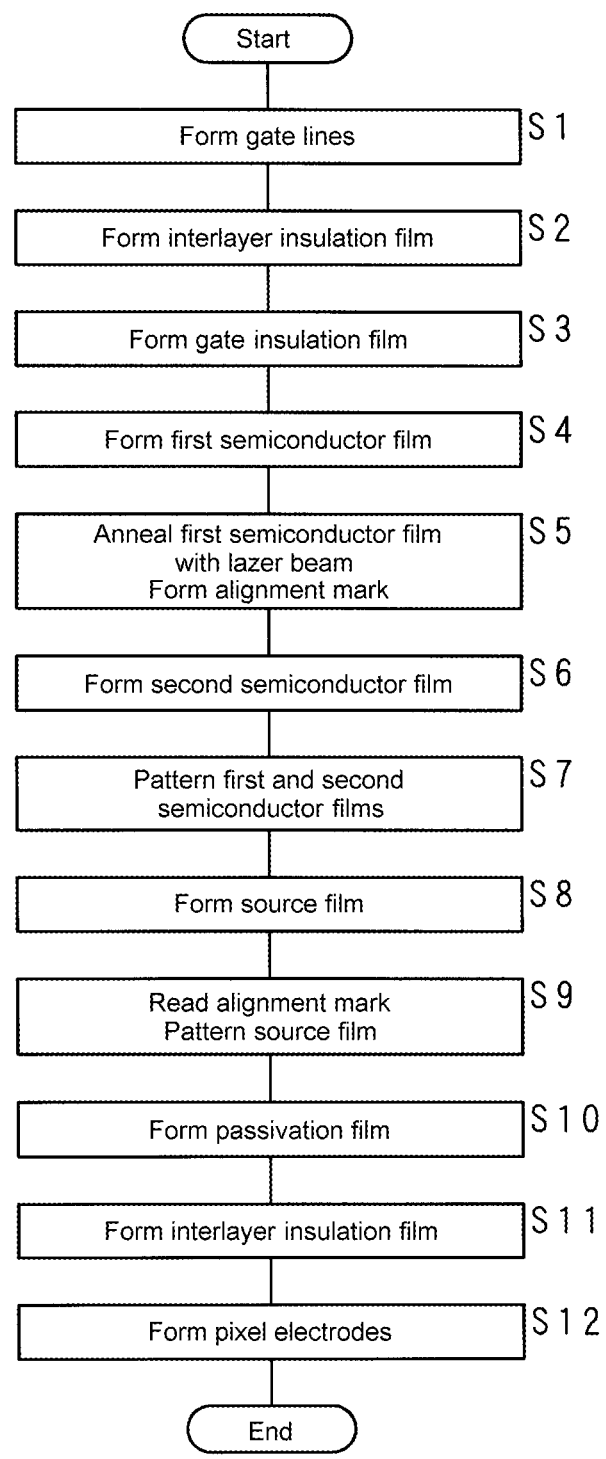
FIG. 9 shows a flow chart indicating a procedure for manufacture of the TFT array region.

FIGS. 6A, 6B, 6C, 7D, 7E, 7F, 8G, 8H, and 8I show schematic cross-sectional views of manufacturing steps in a manufacturing method for a TFT array region 30 according to the presently illustrated embodiment, and FIG. 9 shows a flow chart indicating a procedure for manufacture of the TFT array region 30. The TFT substrate 34 described above is formed by cutting out each of the plurality of TFT array regions 30 formed on a mother glass substrate 70 (described below).

Figure 6A:
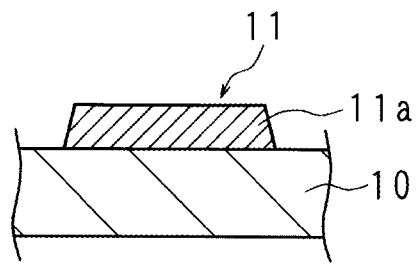
FIGS. 6A, 6B, and 6C show schematic cross-sectional views of manufacturing steps in a manufacturing method for a TFT array region according to Embodiment 1.

First, a metal film made of, for example, Cu is formed over the entire surface of an insulation substrate 10 such as a glass substrate by sputtering, and then the gate line 11 (including a portion serving as the gate electrode 11a) and the capacitor line 13 (not shown in FIG. 6A) are formed by photolithography using a photomask (FIG. 6A, step S1). It should be understood that the material for the metal film is not limited to Cu.

Figure 6B:
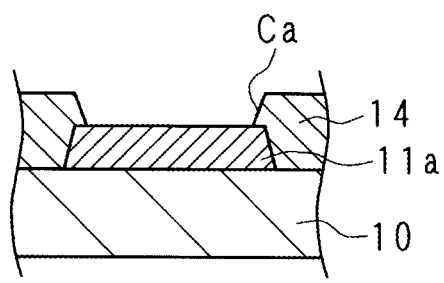

Next, the interlayer insulation film 14 is formed by applying an SOG material to the surface of the insulation substrate 10 including the gate line 11 and the capacitor line 13, and when necessary, by patterning (FIG. 6B, step S2).

Figure 6C:
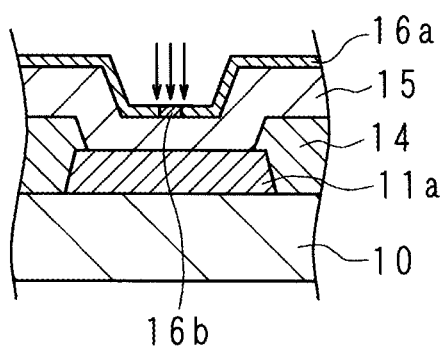

Then, the gate insulation film 15 is formed on the interlayer insulation film 14 by CVD (Chemical Vapor Deposition) using, for example, silicon oxide, or silicon nitride (FIG. 6C, step S3).

Then, a film 16a, made of, for example, intrinsic amorphous silicon, for the first semiconductor film is formed by CVD, and a portion of the film 16a corresponding to the central position of the opening Ca is subjected to a laser annealing process (FIG. 6C, steps S4 and S5). Thus, a polysilicon film 16b is formed.

At this time, a first alignment mark 71 is formed on the mother glass substrate 70.

Figure 10:
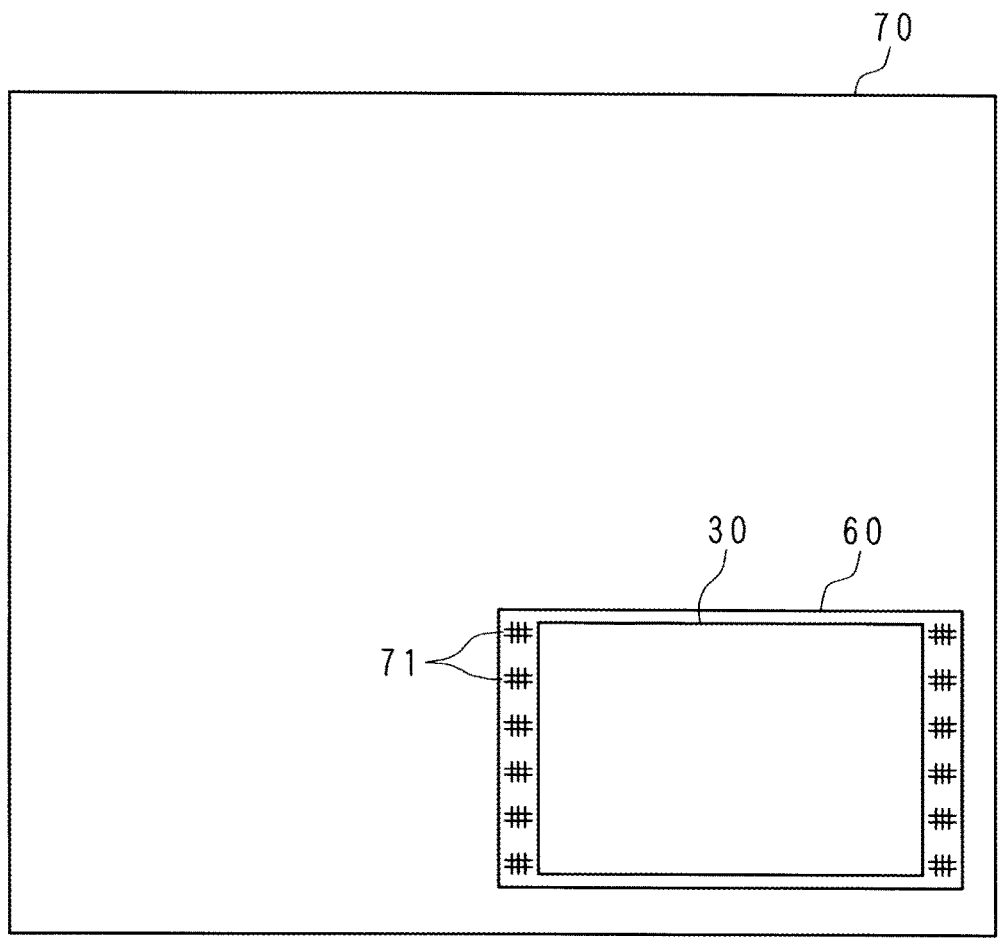
FIG. 10 shows a schematic plan view of a positional relationship among a mother glass substrate, the TFT array region, first alignment marks, and a projected region of a photomask.
Figure 11:
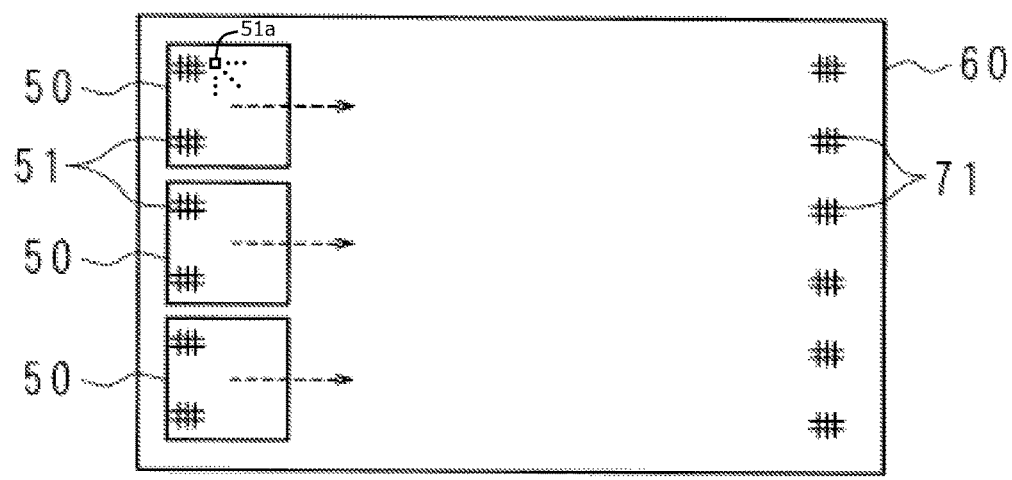
FIG. 11 shows a schematic plan view of a positional relationship between projected regions of a mask and a projected region of a photomask on the mother glass substrate.

FIG. 10 shows a schematic plan view of a positional relationship among the mother glass substrate 70, the TFT array region 30, the first alignment marks 71, and a projected region of a photomask 60 (a second mask), and FIG. 11 shows a schematic plan view of a positional relationship between projected regions of a mask 50 (a first mask) and a projected region of a photomask 60 on the mother glass substrate 70. In FIGS. 10 and 11, an exemplary embodiment is described in which the mother glass substrate 70 has a rectangular shape, and a plurality of the TFT array regions 30 each having a rectangular shape are formed such that the longitudinal direction of the TFT array region 30 coincides with the longitudinal direction of the mother glass substrate 70, and each of the TFT array regions 30 is cut out from the mother glass substrate 70.

The annealing process is performed by irradiating the portion of the film 16a for the first semiconductor film corresponding to the central position of the opening Ca on the gate electrode 11a on the mother glass substrate 70 placed on a substrate stage with a laser beam which is emitted by a laser oscillator and guided through an optical system and a light guide path to pass through a mask stage on which the mask 50 is arranged.

In the presently illustrated embodiment, the first alignment mark 71 for aligning the photomask 60 for a source film 18a (described below) with the TFT array region 30 is formed on the mother glass substrate 70 when the laser annealing process is performed.

As shown in FIG. 11, the mask 50 is arranged in a region to be covered by the photomask 60 in such a way that the length in the short side direction of the photomask 60 is an integer multiple of the length of the side of the mask 50, which is in the direction corresponding to the short side direction of the photomask 60. In other words, the photomask 60 having a short side length that is an integer multiple of the length of the side of the mask 50 in the direction corresponding to the short side direction of the photomask 60 is arranged in a later step in such a way as to cover the region the mask 50 has been arranged. In addition to one or more first openings 51a for laser annealing, one or more openings 51 (second opening) to form the first alignment mark 71 is provided in the mask 50. For example, the opening 51 is formed in a shape in which three lines cross two lines, preferably at right angles. However, the shapes of the opening 51 are not limited to the above-described shape. Alternatively, the mask 50 may be arranged in a region to be covered by the photomask 60 in such a way that the length in the long side direction of the photomask 60 is an integer multiple of the length of the side of the mask 50, which is in the direction corresponding to the long side direction of the photomask 60. In other words, the photomask 60 having a long side length that is an integer multiple of the length of the side of the mask 50 in the direction corresponding to the long side direction of the photomask 60 is arranged in a later step in such a way as to cover the region the mask 50 has been arranged. It should be appreciated that "the side of the mask 50 in the direction corresponding to the short side direction (or long side direction) of the photomask 60" are, for example, the side of the mask 50 positioned in parallel with the short side direction (or long side direction) of the photomask 60. A length of the photomask 60 in a direction being along one side of the photomask 60 being positioned and perpendicular to a direction of scanning with an annealing apparatus may be arranged to be an integer multiple of a length of a side of the mask in a direction perpendicular to the direction of scanning with the annealing apparatus.

After the above-described portion of the film 16a for the first semiconductor film is irradiated with a laser beam, the first alignment mark 71 is formed outside the TFT array region 30 on the mother glass substrate 70 by irradiating the mother glass substrate 70 through the mask 50 with a laser beam with energy higher than that in the annealing condition. Irradiating with a laser beam with energy higher than that in the annealing condition enables to enhance the color contrast to the surroundings and thereby the visibility of the first alignment mark 71 as a mark. It should be appreciated that the annealing process and the formation of the first alignment mark 71 may be carried out in reverse order.

After the first alignment mark 71 is formed outside the left side, for example, of the TFT array region 30, the annealing process is performed sequentially in a row direction (e.g., in the longitudinal direction of the TFT array region 30) by moving the laser oscillator or the mother glass substrate 70, in other word by scanning the mother glass substrate with an annealing apparatus. Then, the first alignment mark 71 is formed outside the right side of the TFT array region 30. However, it should be appreciated that the first alignment mark 71 may be formed only outside the left or right side of the TFT array region 30. For example, the annealing apparatus is moved to scan in a direction from a first side of the TFT array region 30 (a left side, for example, in FIG. 10) to a second side of the TFT array region 30 (a right side, for example, in FIG. 10) being opposed to the first side, thereby, a plurality of the first alignment marks 71 are provided outside of the first side and/or the second side of the TFT array region 30. As shown in FIG. 10, the first side and the second side can be shorter than two other sides of the TFT array region 30, therefore, the direction of scanning with the annealing apparatus can coincide with a longitudinal direction of the TFT array region 30. FIG. 11 shows a state in which the first alignment mark 71 is also formed outside the right side of the TFT array region 30. As in the example of FIG. 11, the first alignment marks 71 may be formed on the portions of the mother glass substrate 70 which are positioned at outside the TFT array region 30 and each opposed to an edge (i.e. at each outside of respective edges) of the TFT array region 30 in the direction of scanning with the annealing apparatus such as the laser oscillator. Further, in order to provide all polysilicon films 16b to be formed in the TFT array region 30, the scanning of the TFT array region 30 with the annealing apparatus may be performed multiple times. In this case, at least one alignment mark 71 may be formed by a single scan with the annealing apparatus on a portion of the mother glass substrate 70 which is positioned at outside the TFT array region 30 and opposed to an edge of the TFT array region 30 in the direction of scanning with the annealing apparatus, and, by performing the scan with the annealing apparatus multiple times, a plurality of first alignment marks 71 may be formed along the direction perpendicular to the direction of scanning with the annealing apparatus.

Next, a film 17a made of, for example, n+ amorphous silicon for the second semiconductor film is formed to cover the film 16a for the first semiconductor film and the polysilicon film 16b (FIG. 7D, step S6).

Further, the first semiconductor film 16 and the second semiconductor film 17 corresponding to the source region and the drain region, respectively, are formed over the gate electrode 11a by patterning the film 16a for the first semiconductor film and the film 17a for the second semiconductor film into an island shape (FIG. 7E, step S7).

The source film 18a made of, for example, Cu is formed on the gate insulation film 15 and the second semiconductor film 17 by sputtering (FIG. 7F, step S8).

Next, the first alignment mark 71 is read, the photomask 60 is aligned to cover the TFT array region 30, and the source film 18a is patterned to form the source electrode 18, the drain electrode 19, the drain connection line 27 (see FIG. 4), and the source line 12 (see FIG. 5) (FIG. 8G, step S9). Specifically, the alignment of the photomask 60 with respect to the annealed portion (the polysilicon film 16b) is performed on the basis of the first alignment mark 71. Then, the source electrode 18, the drain electrode 19, source line 12, and the drain connection line 27 are formed by patterning through the photomask 60. At that time, the capacitor electrode 20 (see FIG. 4) is simultaneously formed on a portion of the gate insulation film 15 provided at the corresponding position to the opening Ca formed on the capacitor line 13.

The position alignment of the photomask 60 with respect to the mother glass substrate 70 will be described in detail below.

The photomask 60 is disposed on the mask stage of the exposure apparatus, and the mother glass substrate 70 is disposed on the substrate stage. Then, the photomask 60 and the first alignment mark 71 on the mother glass substrate 70 are read with a microscope. On the basis of the position of the masks 50 (the position deviation) recognized from the reading, the photomask 60 is positioned on the TFT array region 30, while being aligned physically, and then, aligned optically with respect to the X direction, the Y direction, the direction of rotation, orthogonality, and the magnification. Then, a nonlinear correction or a linear correction may be applied.

During that process, the position of the photomask 60 may be determined on the basis of a plurality of the first alignment marks 71 formed outside the TFT array region 30, for example, twelve of them arranged in two rows, at once or may be adjusted for each annealed region during the exposure in the case where, for example, the projection optical system is moved to scan the TFT array region 30 with respect to the annealed region.

Next, the passivation film 21 is formed on the source electrode 18 and the drain electrode 19 by CVD using, for example, silicon nitride, and the interlayer insulation film 22 is provided by forming an organic film made of, for example, acrylic resin on the passivation film 21 and subjecting the organic film to the patterning process (FIG. 8H, steps S10 and S11).

The pixel electrode 23 is provided by forming an ITO film on the interlayer insulation film 22 by sputtering, and subjecting the ITO film to the patterning (FIG. 8I, step S12).

Figure 12:
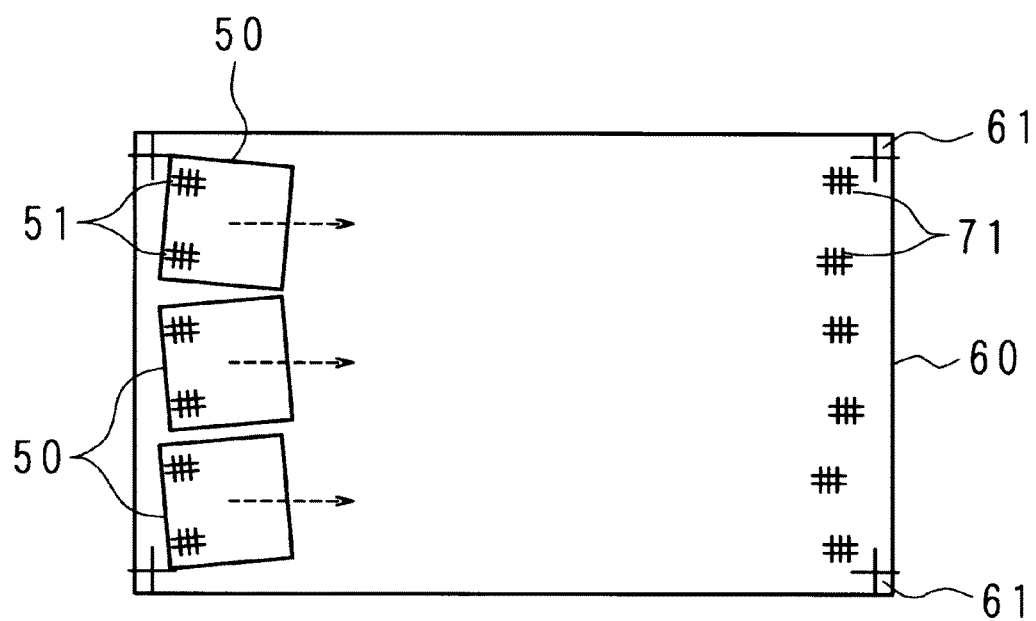
FIG. 12 shows a schematic plan view of a positional relationship between the projected regions of a mask and a projected region of a photomask.

FIG. 12 shows a schematic plan view of the positional relationship between projected regions of a mask 50 and a projected region of a photomask 60.

As shown in FIG. 12, the first alignment marks 71 are formed in accordance with the position deviation of the masks 50 in the columns outside the left and right sides in the figure of the TFT array region 30. A Control unit provided in the exposure apparatus, for example, may align the photomask 60 in accordance with the right side and left side columns of the first alignment marks 71.

In FIG. 12, the reference numeral 61 denotes an alignment mark conventionally used. Conventionally, as described above, the photomask 60 is aligned on the basis of a plurality of alignment marks which are patterned at the time of the photolithography of the gate line. However, with this method, the position deviation, which is generated when the position of the mask 50 is deviated, could not be reflected in the position alignment of the photomask 60.

In the presently illustrated embodiment, the photomask 60 can also be positioned while being subjected to the nonlinear correction of an optical system on the basis of the twelve of the first alignment marks 71 which are formed by using three masks 50. Thus, even in the case where the first alignment marks 71 are not aligned along a straight line, for example, wave as illustrated in FIG. 12, high precision position alignment can be ensured.

In the presently illustrated embodiment, the photomask 60 can be arranged taking into consideration of position deviation of the mask 50, thereby the position alignment accuracy between the annealed portions of the film 16a for the first semiconductor film and the mask pattern for the source electrode 18, the drain electrode 19, the source line 12 and the drain connection line 27 can be improved. In other words, the positional accuracy between the polysilicon film 16b and the source electrode 18, drain electrode 19, source line 12 and drain connection line 27 can be improved.

Therefore, the aforementioned variations in positional accuracy between the TFTs 25 can be reduced. Further, the satisfactory positional accuracy of the films to be formed in later steps also can be attained.

The first alignment mark 71 can be reduced in size because the first alignment mark 71 are formed by laser beam irradiation. By using a microscope, an image of the first alignment mark 71 can be enlarged with high magnification to be read, thereby the positional accuracy of each layer (each film) can be improved. This enables to reduce the light-shielding area, which is designed to include a position deviation of each laminated layer (each laminated film), thereby to produce a display panel 3 having a high opening ratio.

The mask 50 is prone to be displaced in the 8 direction (direction of rotation) or the Y direction which is the direction perpendicular to the direction of scanning with the annealing apparatus (X direction). However, in the presently illustrated embodiment, the first alignment mark 71 is formed, for example, at the end portion in the direction of scanning with the annealing apparatus. Therefore, the deviation of the mask 50 position can be compensated, resulting in the high accuracy of alignment.

In addition, in the presently illustrated embodiment, the photomask is arranged such that the length in the short side direction of the photomask 60 is a multiple of the length of the side of the mask 50, which is in the direction corresponding to the short side direction of the photomask 60. Therefore, the positional deviation of the mask 50 in the short side direction can be reflected in the position alignment, and the variations in positional accuracy can be satisfactorily reduced.

Embodiment 2

Figure 13:
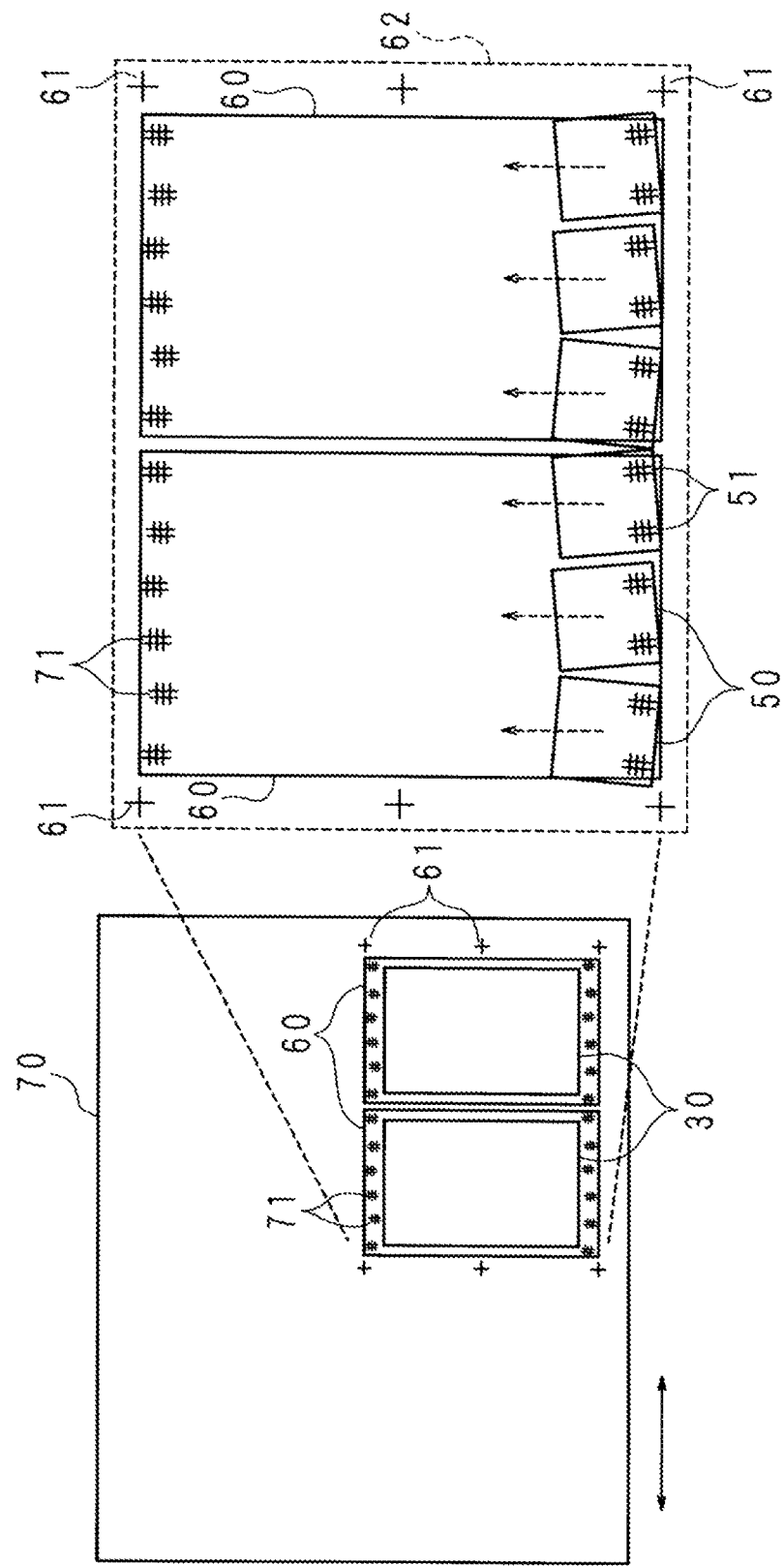
FIG. 13 shows a schematic plan view of a positional relationship among a mother glass substrate, a TFT substrate, alignment mark, and photomask according to Embodiment 2.

FIG. 13 shows a schematic plan view of the positional relationship among the mother glass substrate 70, the TFT array region 30, the first alignment mark 71, and the photomask 60. FIG. 13 shows an exemplary embodiment in which the TFT array regions 30 are formed in plurality such that the longitudinal direction of the TFT array region 30 is positioned perpendicular to the longitudinal direction of the mother glass substrate 70, and each of the TFT array regions 30 is cut out from the mother glass substrate 70. It should be noted that the TFT array region 30 is omitted in the magnified view according to FIG. 13.

In the exemplary embodiment shown in FIG. 13, the direction of the longitudinal direction of the TFT array region 30 with respect to the longitudinal direction of the mother glass substrate 70 is rotated by 90 degrees from the direction of the longitudinal direction of the TFT array region 30 with respect to the longitudinal direction of the mother glass substrate 70 described in Embodiment 1. That is, a plurality of TFT array regions 30 each having a rectangular shape are formed such that the short side direction of the TFT array region 30 coincides with the longitudinal direction of the mother glass substrate 70. The solid arrow shown in the lower left side of FIG. 13 indicates the direction of scanning with the exposure apparatus.

As shown in the magnified part of FIG. 13, six masks 50 for the annealing apparatus are arranged across two TFT array regions 30 in the row direction (the longitudinal direction) of the mother glass substrate 70, and simultaneously subjected to the laser annealing process using the six of the masks 50, and then, the annealing apparatus is moved to scan from the bottom to the top of FIG. 13, i.e., in the column direction (the short side direction) of the mother glass substrate 70. Therefore, the annealing apparatus is move to scan in the longitudinal direction of the TFT array regions 30.

After a portion of the film 16a for the first semiconductor film to be positioned in a bottom row in the longitudinal direction of each of the TFT array regions 30 is irradiated with a laser beam, the first alignment mark 71 is formed outside the TFT array region 30 on the mother glass substrate 70 using a laser beam with energy higher than that in the annealing condition. The first alignment mark 71 is also formed on the upper outside of the TFT array region 30 in the longitudinal direction of the TFT array region 30. Treating with energy higher than in the annealing condition enables to enhance the color contrast to the surroundings and thereby the visibility of the first alignment marks 71 as a mark.

The magnified view according to FIG. 13 shows a state in which the first alignment mark 71 is formed outside the upper side of the TFT array region 30 on the mother glass substrate 70.

Conventionally, a photomask 62 to cover two of the TFT array regions 30 is arranged on the basis of the alignment mark 61. However, in the presently illustrated embodiment, the photomask 60 can be arranged to minimize a position deviation in the respective TFT array regions 30. This enables to reduce a margin for the alignment.

Embodiment 3

A manufacturing method for the TFT array region 30 according to Embodiment 3 is different from the manufacturing methods for the TFT array region 30 according to Embodiments 1 and 2 in that an alignment mark (a second alignment mark) 26 is formed on the basis of a first alignment mark 71.

Figure 14:
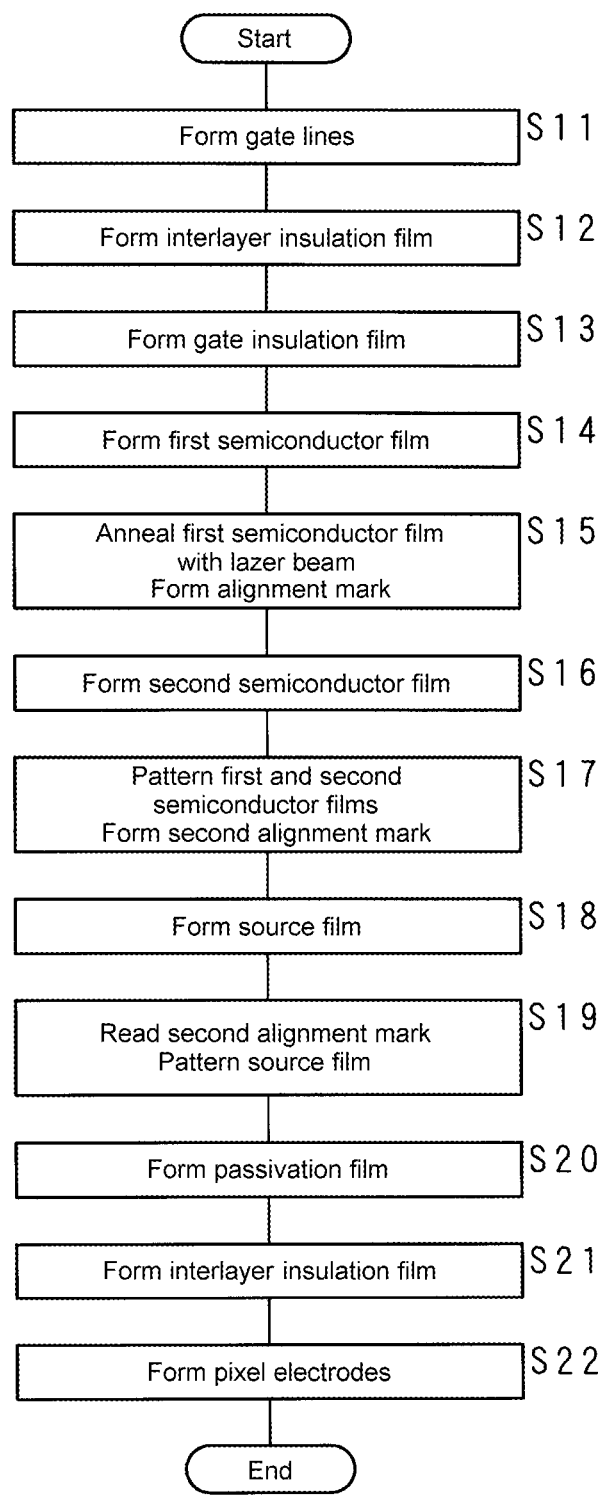
FIG. 14 shows a flow chart indicating a manufacturing method for a TFT substrate according to Embodiment 3.
Figure 15:
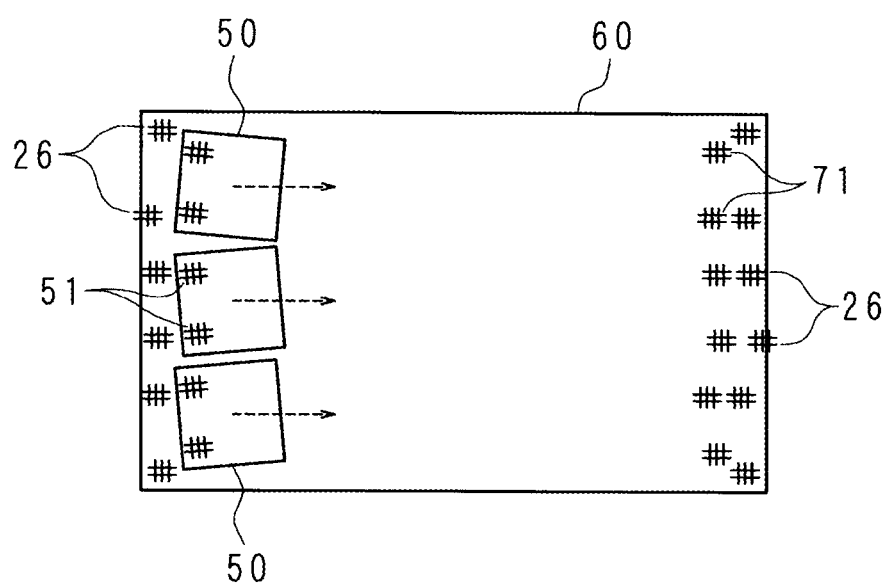
FIG. 15 shows a schematic plan view of a relationship between masks and a photomask.
Figure 16:
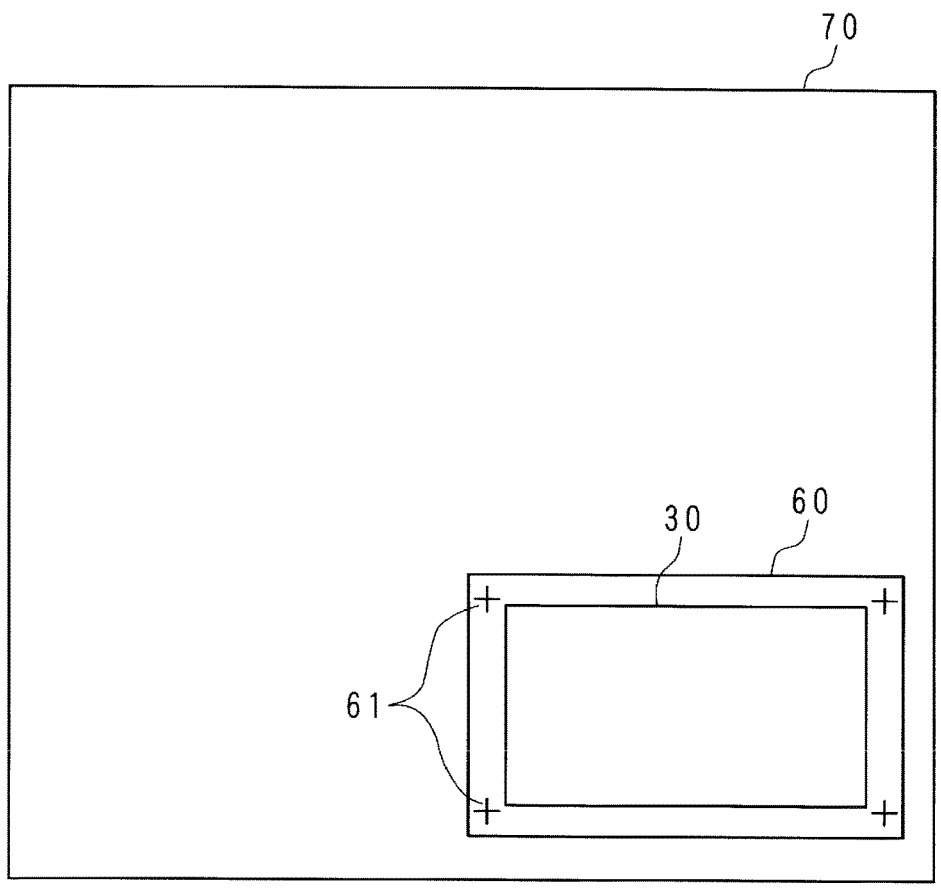
FIG. 16 shows a schematic plan view of a TFT array region and a projected region on which a photomask is projected on a mother glass substrate.
Figure 17:
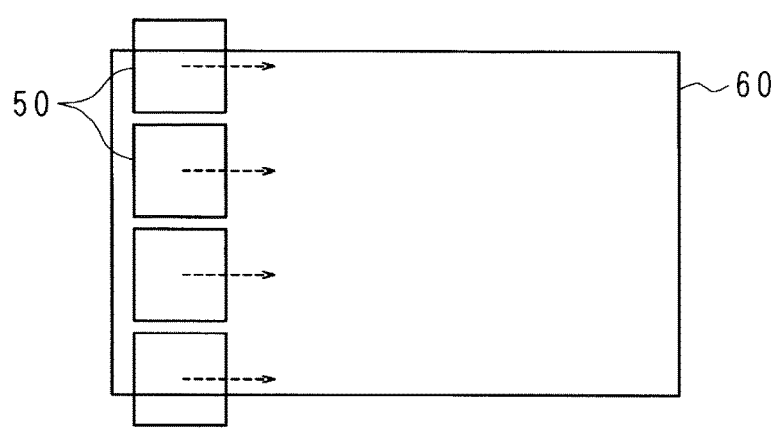
FIG. 17 shows a schematic plan view of a positional relationship between a projected region on which the mask is projected and a projected region on which a photomask is projected on the mother glass substrate.

FIG. 14 shows a flow chart indicating a manufacturing method for a TFT substrate 30 according to Embodiment 3, and FIG. 15 shows a schematic plan view of a relationship between a mask 50 and a photomask 60. An exemplary embodiment in which a TFT array region 30 having a similar structure to the TFT array region 30 according to Embodiment 1 is manufactured will be described below. As with Embodiment 1, the interlayer insulation film 14 may not be formed.

First, a metal film is formed over the entire surface of an insulation substrate 10 such as a glass substrate by sputtering, and then a gate line 11 (including a gate electrode 11a) and a capacitor line 13 are formed by photolithography using a photomask (step S11).

Next, the interlayer insulation film 14 is formed by applying an SOG material to the surface of the insulation substrate 10 including the gate line 11 and the capacitor line 13, and when necessary, by patterning (step S12).

Then, a gate insulation film 15 is formed on the interlayer insulation film 14 by CVD by using, for example, silicon oxide, or silicon nitride (step S13).

Then, the film 16a, made of, for example, intrinsic amorphous silicon, for the first semiconductor film is formed by CVD (step S14).

A portion of the film 16a corresponding to the central position of an opening Ca is subjected to a laser annealing process (step S15). Thus, a polysilicon film 16b is formed.

At this time, a first alignment mark 71 is formed on the mother glass substrate 70, as with Embodiment 1.

During this procedure, a mask 50 shown in FIG. 15 is used. An opening 51 to form the first alignment mark 71 is provided in the mask 50. After the above-described portion of the film 16a for the first semiconductor film is irradiated with a laser beam, the first alignment mark 71 is formed outside the TFT array region 30 on the mother glass substrate 70 by irradiation with a laser beam with energy higher than that in the annealing condition.

After the first alignment mark 71 is formed outside the left side, for example, of the TFT array region 30, the annealing process is performed sequentially in a row direction (for example, in the longitudinal direction of the mother glass substrate 70) by moving the laser oscillator or the mother glass substrate 70. FIG. 15 shows a state in which the first alignment mark 71 is formed outside the right side of the TFT array region 30 on the mother glass substrate 70.

Next, the film 17a made of, for example, n+ amorphous silicon for a second semiconductor film is formed to cover the film 16a for the first semiconductor film and the poly silicon film 16b (step S16).

Further, the first semiconductor film 16 and the second semiconductor film 17 are formed over the gate electrode 11a by patterning the film 16a for the first semiconductor film and the film 17a for the second semiconductor film into an island shape by, for example, photolithography and etching (step S17).

At that time, a second alignment mark 26 is formed on the basis of the first alignment mark 71.

The first alignment mark 71 is read by using a microscope provided in an exposure apparatus for photolithography of the first and second semiconductor films, and the second alignment mark 26 is formed outside the first alignment mark 71, for example, on the mother glass substrate 70 by patterning the film 16a for the first semiconductor film and the film 17a for the second semiconductor film by photolithography and etching.

It should be understood that the second alignment mark 26 may not be formed outside the first alignment mark 71 as long as it is formed outside the TFT array region 30.

The source film 18a made of, for example, Cu is formed on the gate insulation film 15 and the second semiconductor film 17 by sputtering (step S18).

Next, the second alignment mark 26 is read, the photomask 60 is aligned to cover the TFT array region 30, and the source film 18a is patterned to form the source electrode 18, the drain electrode 19, the drain connection line 27, and the source line 12 (step S19). Specifically, the alignment of the photomask 60 with respect to the annealed portion (the polysilicon film 16b) is performed on the basis of the second alignment mark 26. Then, the source electrode 18, the drain electrode 19, the source line 12, and the drain connection line 27 are formed by the patterning through the photomask 60.

The position alignment of the photomask 60 with respect to the mother glass substrate 70 is performed as follows.

The photomask 60 and the second alignment mark 26 on the mother glass substrate 70 are read by a microscope, and, the photomask 60 is positioned on the TFT array region 30, while being aligned physically, and then, aligned optically with respect to the X direction, the Y direction, the direction of rotation, orthogonality, and the magnification. Then, a nonlinear correction or a linear correction may be applied.

During that process, the position of the photomask 60 may be determined on the basis of a plurality of the second alignment marks 26 formed outside the TFT array region 30, for example, twelve of them arranged in two rows, at once or may be adjusted for each annealed region.

Further, the passivation film 21 is formed on the source electrode 18 and the drain electrode 19 by CVD using, for example, silicon nitride (step S20), and the interlayer insulation film 22 is provided by forming an organic film made of, for example, acrylic resin on the passivation film 21 and subjecting the organic film to the patterning process (step S21).

The pixel electrode 23 is provided by forming an ITO film on the interlayer insulation film 22 by, for example, sputtering, and subjecting the ITO film to the patterning (step S22).

In the presently illustrated embodiment, the photomask 60 can be arranged taking into consideration of position deviation of the masks 50, thereby the position alignment accuracy between the annealed portions of the film 16a for the first semiconductor film and the mask pattern for the source electrode 18, the drain electrode 19, the source line 12, and the drain connection line 27 can be improved.

Further, in the presently illustrated embodiment, since the second alignment mark 26 is formed by performing a patterning by photolithography, the visibility of the second alignment mark 26 is enhanced.

Further, the variations in positional accuracy between the position irradiated with a laser and the position of, for example, source line are reduced, and therefore, the process according to the presently illustrated embodiment can be applied when a narrower region for a semiconductor film needs to be formed in order to attain high definition.

It should be appreciated that the scope of the present invention is not limited to the context of the exemplary Embodiments 1 to 3, and the meaning equivalent to the claims and all modifications such as modifications obtainable by combining the modified technical means within the scope of the claims are intended to be included.

For example, the present invention is intended not to be restrictive to the method in which a channel region is formed by annealing a first semiconductor film made of amorphous silicon to convert the amorphous silicon into polysilicon.

Further, the shapes and the numbers of the alignment marks are not limited to the shapes and the numbers described in the exemplary Embodiments 1 to 3.

A manufacturing method of a thin-film transistor substrate according to one embodiment of the present invention includes: annealing a semiconductor film being formed on a gate insulation film covering a gate electrode with a laser beam by using a mask, the gate electrode being formed within a thin-film transistor substrate region on a substrate; forming a first alignment mark outside the thin-film transistor substrate region on the substrate, by irradiating the substrate through the mask with the laser beam; patterning the semiconductor film by photolithography and etching; forming a conductive film on the semiconductor film; positioning a photomask on the basis of the first alignment mark; and forming a source electrode and a drain electrode by patterning the conductive film through the photomask; wherein the first alignment mark is formed while annealing the semiconductor film.

In the presently illustrated embodiment, the first alignment mark is formed on the mother glass substrate on the basis of the position of the mask for annealing, and the position alignment during a pattern formation process of, for example, a source line is performed on the basis of the first alignment mark. Therefore, even when a small position deviation of the mask is generated during the annealing process of the semiconductor film, the source electrode, the drain electrode, the source line, and the drain connection line can be formed on the semiconductor film in accordance with the position deviation. Thus, the positional accuracy between the annealed region and the source electrode, drain electrode can be improved, and the variations in positional accuracy between TFTs can be reduced. Further, the satisfactory positional accuracy of the films to be formed in later steps also can be attained.

In a manufacturing method for a thin-film transistor substrate according to another embodiment of the present invention, a second alignment mark may be formed outside the thin-film transistor substrate region on the substrate on the basis of the first alignment mark when the semiconductor film is patterned, and the source electrode and the drain electrode may be formed by patterning the conductive film with use of the photomask arranged over the conductive film on the basis of the second alignment mark.

According to the presently illustrated embodiment, since the second alignment mark is formed by patterning, the visibility of the second alignment mark and the positional accuracy can be further enhanced and the variations in positional accuracy between TFTs can be further reduced.

In a manufacturing method for a thin-film transistor substrate according to yet another embodiment of the present invention, one or more first openings to be used for annealing the semiconductor film and one or more second openings to be used for forming the first alignment mark may be provided in the mask.

According to the presently illustrated embodiment, since the first and second openings are provided in the mask, the first alignment mark can be formed at a position accurately corresponding to the position deviation of the annealed region of the semiconductor film.

In a manufacturing method for a thin-film transistor substrate according to yet another embodiment of the present invention, the thin-film transistor substrate region may have a rectangular shape, an annealing apparatus may be moved to scan in a first direction from a first side of the thin-film transistor substrate region to a second side of the thin-film transistor substrate region being opposed to the first side, and a plurality of the first alignment marks may be provided on portions of the substrate, the portions positioned at outside of the first side and/or the second side of the thin-film transistor substrate region.

The mask is prone to be displaced in the Y direction or the θ direction (direction of rotation) with respect to the scanning direction of the annealing apparatus (the X direction). In the presently illustrated embodiment, the alignment marks are formed on one end portion or on both end portions in the scanning direction, and therefore, the deviation of the mask position can be compensated, resulting in the high accuracy of alignment. Further, making the direction of scanning of the annealing apparatus and the direction of scanning of the exposure apparatus same can further improve the accuracy of position alignment.

In a manufacturing method for a thin-film transistor substrate according to yet another embodiment of the present invention, the thin-film transistor substrate region may have a rectangular shape having the first side and the second side and two other sides, the first side and the second side being shorter than the two other sides, the first direction may coincides with a longitudinal direction of the thin-film transistor substrate region.

The mask is prone to be displaced in the Y direction or the θ direction (direction of rotation) with respect to the scanning direction of the annealing apparatus. In the presently illustrated embodiment, the alignment marks are formed on one end portion or on both end portions in the direction of scanning, which coincides with longitudinal direction of the thin-film transistor substrate region, and therefore, the deviation of the mask position can be compensated, resulting in the high accuracy of alignment.

In a manufacturing method for a thin-film transistor substrate according to yet another embodiment of the present invention, the mask and the photomask each may have rectangular shape, a length of the photomask in a second direction may be arranged to be an integer multiple of a length of a side of the mask in the second direction, the second direction being along one side of the photomask being positioned and perpendicular to a direction of scanning with an annealing apparatus.

According to the presently illustrated embodiment, the position deviation of the mask in the direction perpendicular to the direction of scanning with the annealing apparatus can be reflected in the position alignment, and variations in positional accuracy can be more satisfactorily reduced.

What is claimed is:

1. A method of manufacturing a thin-film transistor substrate comprising:
    annealing a semiconductor film being formed on a gate insulation film covering a gate electrode with a laser beam by using a mask, the gate electrode being formed within a thin-film transistor substrate region on a substrate;
    forming a first alignment mark outside the thin-film transistor substrate region on the substrate, by irradiating the substrate through the mask with the laser beam;
    patterning the semiconductor film by photolithography and etching;
    forming a conductive film on the semiconductor film;
    positioning a photomask on the basis of the first alignment mark; and
    forming a source electrode and a drain electrode by patterning the conductive film through the photomask;
    wherein the first alignment mark is formed while annealing the semiconductor film, and
    one or more first openings to be used for annealing the semiconductor film and one or more second openings to be used for forming the first alignment mark are provided in the mask.

2. The method of claim 1, wherein a second alignment mark is formed outside the thin-film transistor substrate region on the substrate on the basis of the first alignment mark when the semiconductor film is patterned, and
    the source electrode and the drain electrode are formed by patterning the conductive film with use of the photomask arranged over the conductive film on the basis of the second alignment mark.

3. The method of claim 1, wherein the thin-film transistor substrate region has a rectangular shape,
    an annealing apparatus is moved to scan in a first direction from a first side of the thin-film transistor substrate region to a second side of the thin-film transistor substrate region being opposed to the first side, and
    a plurality of the first alignment marks are provided on portions of the substrate, the portions positioned at outside of the first side and/or the second side of the thin-film transistor substrate region.

4. The method of claim 3, wherein the thin-film transistor substrate region has a rectangular shape having the first side and the second side and two other sides, the first side and the second side being shorter than the two other sides,
    the first direction coincides with a longitudinal direction of the thin-film transistor substrate region.

5. The method of claim 1, wherein the mask and the photomask each have rectangular shape, a length of the photomask in a second direction is arranged to be an integer multiple of a length of a side of the mask in the second direction, the second direction being along one side of the photomask being positioned and perpendicular to a direction of scanning with an annealing apparatus.

6. The method of claim 1, wherein the first alignment mark is formed on each of portions of the substrate, each of the portions positioned at an outside of respective edges of the thin-film transistor substrate region in a direction of scanning with the annealing apparatus.

7. The method of claim 1, wherein at least one first alignment mark is formed by a single scan with the annealing apparatus on a portion of the substrate, the portion positioned at an outside of an edge of the thin-film transistor substrate region in a direction of scanning with the annealing apparatus, and
    a plurality of the first alignment marks are formed along a direction perpendicular to the direction of scanning with the annealing apparatus, by performing a scan of the thin-film transistor substrate region with the annealing apparatus multiple times.

8. The method of claim 1, wherein energy of the laser beam to form the first alignment mark is higher than energy of the laser beam used when the semiconductor film is annealed.

* * * * *